United States Patent
Chu et al.

(10) Patent No.: US 10,784,189 B2
(45) Date of Patent: Sep. 22, 2020

(54) MOUNTING RACK WITH CIRCUIT

(71) Applicant: Fusheng Electronics Corporation, Hsin-Chu (TW)

(72) Inventors: Chen-Feng Chu, Hsin-Chu (TW); Yuan-Fu Chen, Hsin-Chu (TW)

(73) Assignee: FUSHENG ELECTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/394,994

(22) Filed: Apr. 25, 2019

(65) Prior Publication Data

US 2019/0341340 A1 Nov. 7, 2019

(30) Foreign Application Priority Data

May 4, 2018 (TW) .............................. 107205799 U

(51) Int. Cl.
*H01L 23/495* (2006.01)
*H01L 33/38* (2010.01)
*H01L 33/54* (2010.01)
*H01L 33/58* (2010.01)

(52) U.S. Cl.
CPC .. *H01L 23/49562* (2013.01); *H01L 23/49537* (2013.01); *H01L 33/38* (2013.01); *H01L 33/54* (2013.01); *H01L 33/58* (2013.01)

(58) Field of Classification Search
CPC . H01L 23/495–49596; H01L 23/49541; H01L 23/49548; H01L 23/49558; H01L 23/49565; H01L 23/49579; H01L 23/49586; H01L 23/49861; H01L 33/52–58; H01L 23/4985; H01L 23/49805; H01L 23/49562; H01L 23/49537; H01L 21/4821–4842; H01L 33/38; H01L 23/62; H01L 23/483; H01L 33/58; H01L 23/049; H01L 2224/48247; H01L 2224/48091; H01L 2224/48471
See application file for complete search history.

(56) References Cited

U.S. PATENT DOCUMENTS

2018/0233643 A1* 8/2018 Wu ..................... H01L 33/483

* cited by examiner

*Primary Examiner* — Nelson Garces
(74) *Attorney, Agent, or Firm* — Chun-Ming Shih; HDLS IPR SERVICES

(57) ABSTRACT

A mounting rack with circuit includes a leadframe, a molding seat and a circuit layer. The leadframe comprises a plurality of electrodes. The molding seat is arranged on the leadframe and has a cup body to expose backsides of the electrodes and a cup opening to expose front sides of the electrodes. The circuit layer is arranged on the cup body and at least comprises two conductive parts, two electrical-connection parts and two soldering pads, wherein the two electrical-connection parts are arranged on the cup opening, one end of each of the two electrical-connection parts is electrically connected to one end of a respective one of the two conductive parts, the two soldering pads are arranged on bottom of the cup body, each of the two soldering pads is electrically connected to the other end of a respective one of the two conductive parts.

4 Claims, 11 Drawing Sheets

MOUNTING RACK WITH CIRCUIT

BACKGROUND OF THE INVENTION

Technical Field

The present invention relates to an identification device, especially to a mounting rack with circuit and generating a plurality of light dots to object to be sensed.

Description of Related Art

Nowadays face ID technique has been used in smart electronic device (such as smart phone) to enhance the security level of the smart electronic device.

The unlocking process for face ID includes following two steps: determining whether the smart phone to be unlocked is purposely handled by user to approach user face or the user carelessly move the smart phone near his/her face; and starting face ID after the smart phone determines that the smart phone to be unlocked is purposely handled by user to approach user face. A plurality of electronic elements needs to be turned on for the unlocking process for face ID and considerable electric power is consumed. Therefore, the face ID is only conducted after the smart phone determines that the smart phone to be unlocked is purposely handled by user to approach user face.

When face or other object approaches, the proximity sensor is first turned on, the proximity sensor then activates the flood illuminator to emit non-structured infrared light onto the object surface. The infrared camera received the reflected image data and then sends the received data to microprocessor built in the smart phone. The dual-core neural engine built in the microprocessor identifies face through AI and then dot projector is activated to generate a plurality of light dots emitted toward user face. The array of light dots is sensed by the infrared camera and distance (depth) information corresponding to different locations of user face is calculated. The depth information corresponding to different locations of user face is then sent to the microprocessor of the smart phone to determine whether the current user is the genuine owner of the smart phone.

The mounting rack of the projector is not manufactured with conduction circuit for the filtering lens. The conduction circuit for the filtering lens is connected from the circuit board to the mounting rack of the projector. Namely, the circuit board is electrically connected with a molding seat and the rack for the projector is arranged on the molding seat. A conductive wire is connected from the circuit board and to the filtering lens through the molding seat to supply power to the projector. However, the above arrangement has drawbacks of long manufacture time, lots of procedures and higher cost for the projector. Besides, the thus manufactured projector is bulky and occupies considerable space within the smart phone. Besides, the circuit board still drives the laser diode within the projector to emit light even when the filtering lens is broken, which will cause erroneous determination of signals.

SUMMARY OF THE INVENTION

It is an object of the present invention to solve the problems of the conventional projector. The present invention directly manufactures the conduction circuit of the filtering lens on the molding seat of the projector rack to form mounting rack with circuit. The mounting rack has easy manufacture, lower manufacture cost and more compact size.

It is another object of the present invention to manufacture the conduction circuit of the filtering lens on the molding seat such that the laser diode in the projector is not turned on when the filtering lens is broken or damaged.

Accordingly, the present invention provides a mounting rack with circuit, the mounting rack comprising: a leadframe comprising a plurality of electrodes; a molding seat arranged on the leadframe and comprising a cup body, the cup body comprising a cup opening, wherein backsides of the electrodes are exposed through bottom of the cup body, and front sides of the electrodes are exposed through the cup opening; and a circuit layer arranged on the cup body and at least comprising two conductive parts, two electrical-connection parts and two soldering pads, wherein the two electrical-connection parts are arranged on the cup opening, one end of each of the two electrical-connection parts is electrically connected to one end of a respective one of the two conductive parts, the two soldering pads are arranged on bottom of the cup body, each of the two soldering pads is electrically connected to the other end of a respective one of the two conductive parts.

According to one embodiment, the cup opening is of stair shape.

According to one embodiment, the cup body has two grooves extended from a top side of the cup opening to a bottom side of the cup body.

According to one embodiment, the two conductive parts are respectively arranged in the two grooves, the two electrical-connection parts are arranged on inner wall of the cup body.

According to one embodiment, the soldering pads are respectively electrically connected to the electrodes, or not electrically connected to the electrodes.

According to one embodiment, the two conductive parts are respectively arranged on surface of the cup body and the two electrical-connection parts are arranged on top side of the cup body.

According to one embodiment, the cup body has two through holes extended from a top side of the cup opening to the bottom of the cup body.

According to one embodiment, the two conductive parts are respectively arranged in the two through holes.

According to one embodiment, the cup body has two through holes extended from a top side of the cup opening to front faces of the electrodes.

According to one embodiment, the two conductive parts are respectively arranged in the two through holes and electrically connected to the electrodes.

Accordingly, the present invention provides a mounting rack with circuit, comprising: a leadframe comprising a plurality of electrodes; a molding seat arranged on the leadframe and comprising a cup body, backsides of the electrodes being exposed through bottom of the cup body, the cup body comprising a cup opening, the cup opening comprising a first cup opening and a second cup opening, front sides of the electrodes being exposed through the first cup opening and the second cup opening, the second cup opening having two apertures extended from top side of the second cup opening to the bottom of the cup body; and a circuit layer arranged on the cup body and comprising two conductive parts, two electrical-connection parts and two soldering pads, wherein the two conductive parts respectively comprises a first conductive part and a second conductive part, the two electrical-connection parts are arranged on top face and inner wall of the first cup opening, the two first conductive parts are arranged on a top face of the second cup opening, one end of each of the first conductive part is electrically connected to one end of a respective one of the electrical-connection part, the other end of each of the first conductive part is electrically connected to one end of a respective one of the second conductive parts arranged in the apertures, the other end of each of the second conductive parts is electrically connected to the respective soldering pads arranged on the bottom of the cup body.

According to one embodiment, the cup opening is of stair shape.

According to one embodiment, the electrical-connection part comprises a plurality of T-shaped contacts.

BRIEF DESCRIPTION OF DRAWING

The present invention can be more fully understood by reading the following detailed description of the embodiment, with reference made to the accompanying drawings as follows.

DETAILED DESCRIPTION

Figure 1:
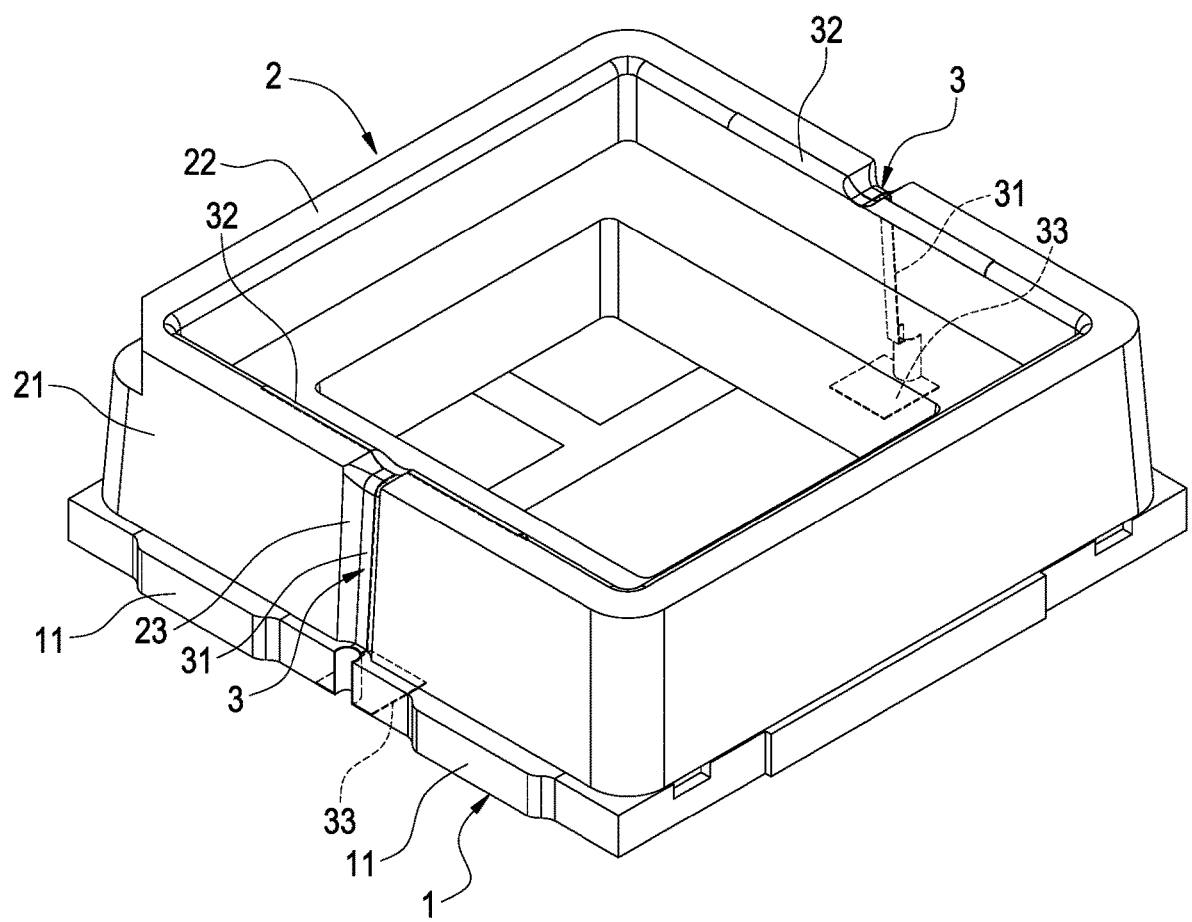
FIG. 1 shows the perspective view of the mounting rack with circuit according to the first embodiment of the present invention.
Figure 2:
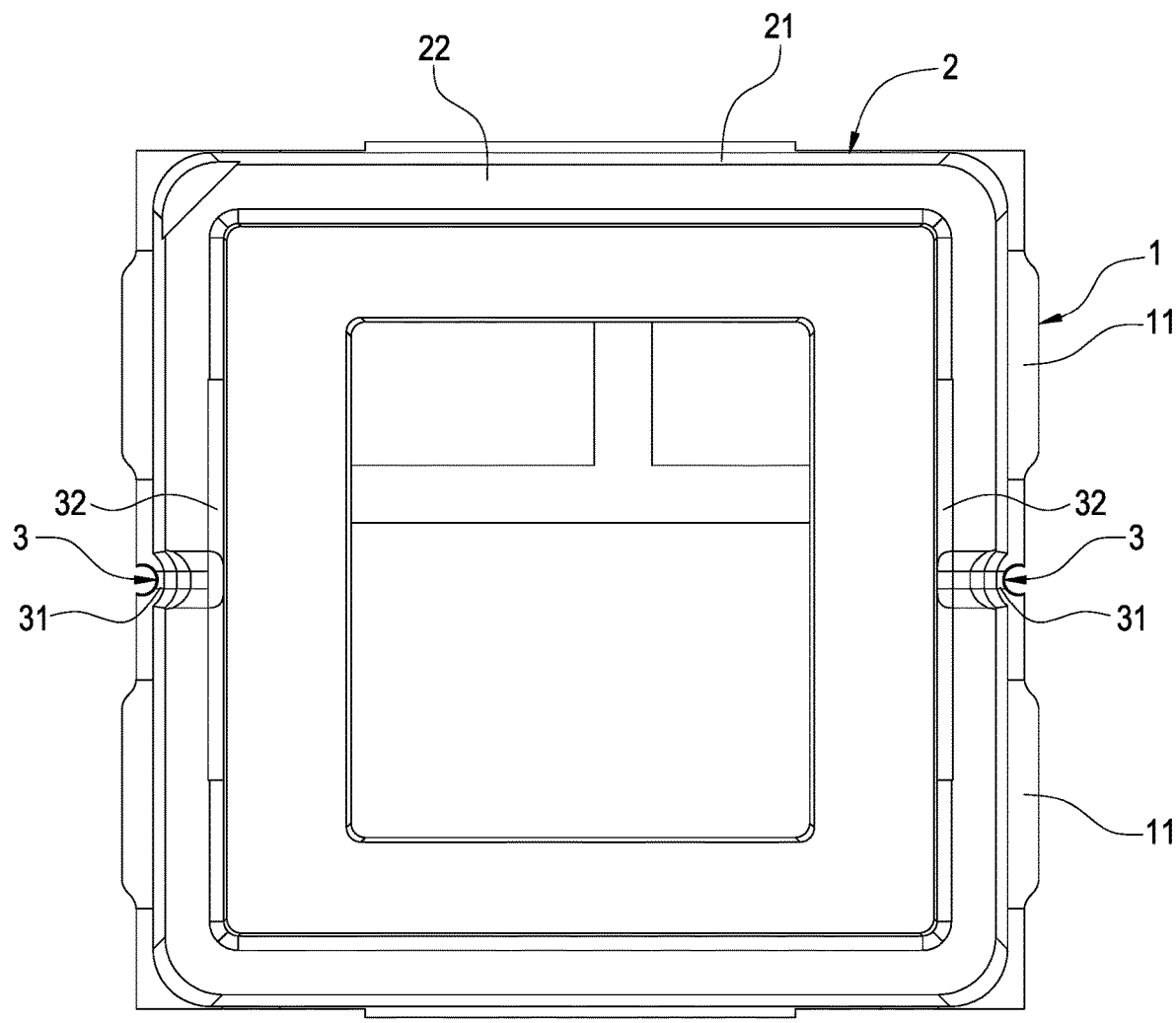
FIG. 2 is the top view corresponding to FIG. 1.
Figure 3:
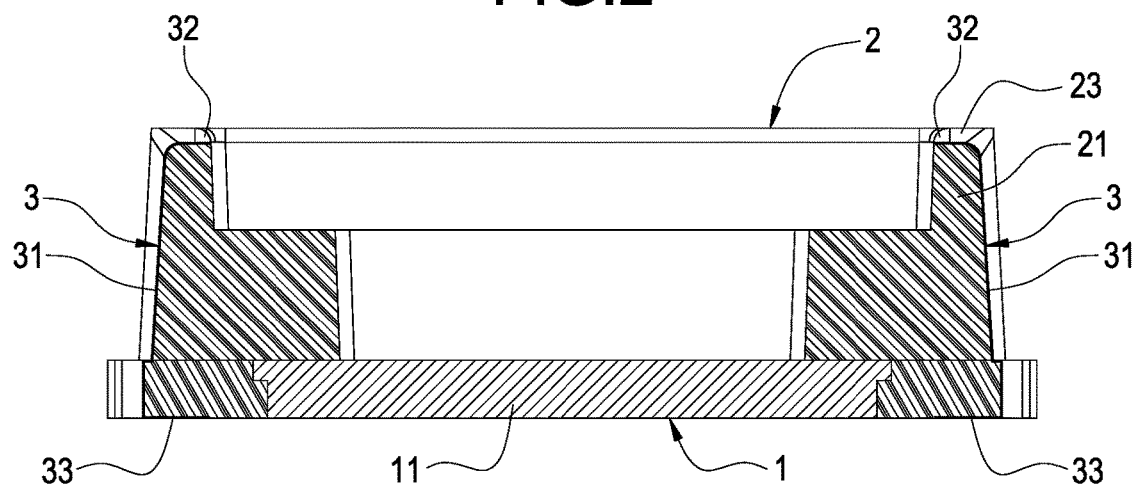
FIG. 3 is the sectional view corresponding to FIG. 1.
Figure 4:
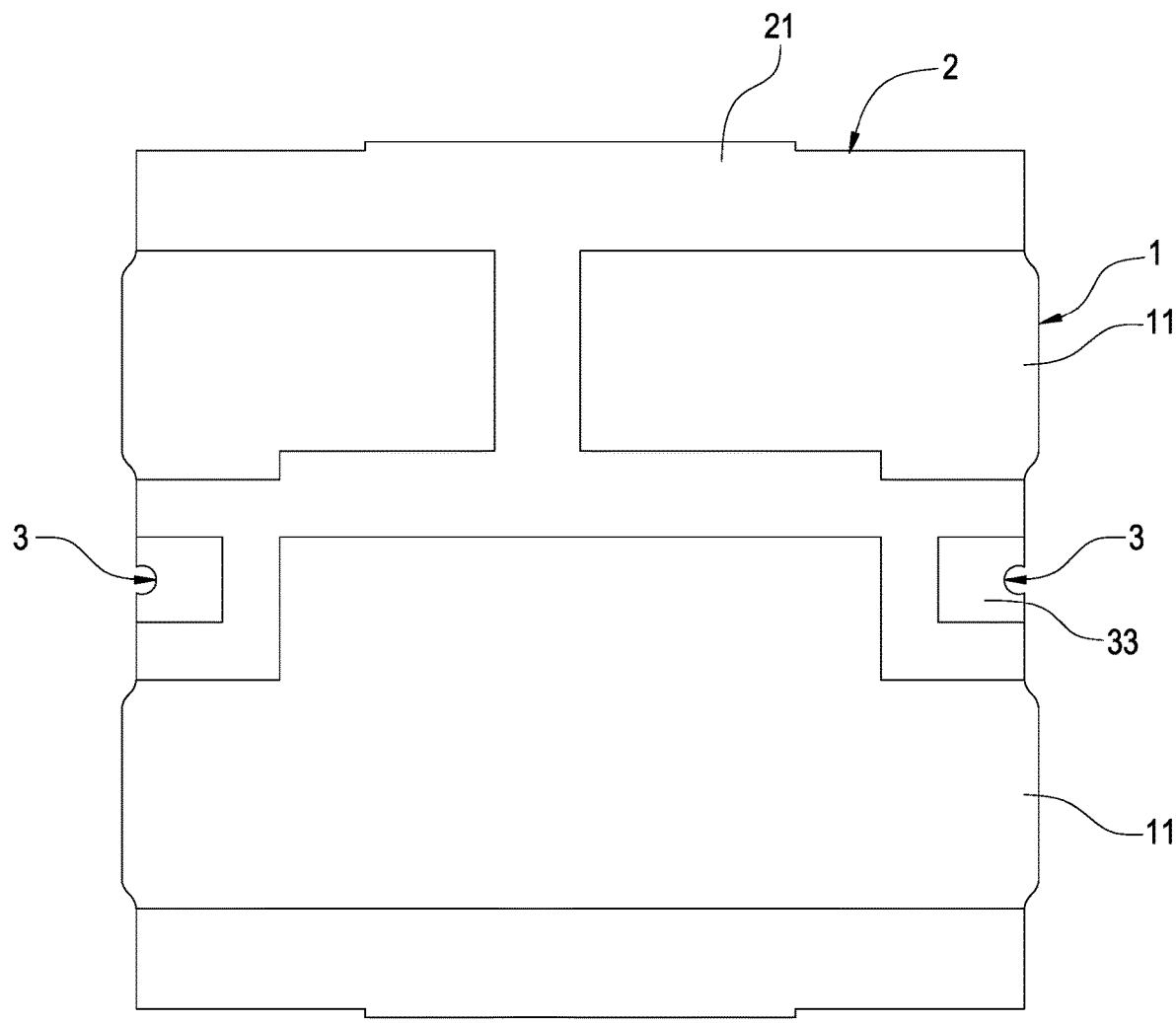
FIG. 4 is the bottom view corresponding to FIG. 1.

Reference will now be made to the drawing figures to describe the present invention in detail. It will be understood that the drawing figures and exemplified embodiments of present invention are not limited to the details thereof.

FIGS. 1 to 4 show the perspective view, the top view, the sectional view and the bottom view of the mounting rack with circuit according to the first embodiment of the present invention. As shown in those figures, the mounting rack with circuit comprises a leadframe 1, a molding seat 2 and a circuit layer 3.

The leadframe 1 is processed by pressing metal or etching metal to form a plurality of electrodes 11, the electrodes 11 are used for mounting die (not shown in those figures) or bonding wire (not shown in those figures).

The molding seat 2 is formed by hot-pressing or mold ejection with plastics to form upon the leadframe 1. The molding seat 2 has a cup body 21 through the bottom of the cup body 21 the electrodes are exposed. The cup body 21 has a cup opening 22 to expose front portions of the electrodes 11 for mounting die (not shown in those figures) or bonding wire (not shown in those figures). Moreover, the cup body 21 has two symmetric and elongated grooves 23 on outer face thereof. Each of the grooves 23 extends from the top of the cup opening 22 to the bottom of the cup body 21. As shown in those figures, the cup opening 22 is of stair shape.

The circuit layer 3 is arranged in the two grooves 23 and comprises two conductive parts 31, two electrical-connection parts 32 and two soldering pads 33. The two conductive parts 31 are arranged in the two grooves 23. The two electrical-connection parts 32 are arranged on inner wall of the cup opening 22 and opposite to each other. Each of the electrical-connection parts 32 is electrically connected to one end of the respective conductive part 31. The two soldering pads 33 are arranged on the bottom of the cup body 21 and each is connected to the other end of the respective conductive part 31. Besides, the two soldering pads 33 are respectively electrically connected to the electrodes 11 of the leadframe 1, or not electrically connected to the electrodes 11 of the leadframe 1. Therefore, the circuit layer 3 is electrically connected to the filtering lens (not shown) with transparent conductive wire such as ITO (indium oxide).

Figure 5:
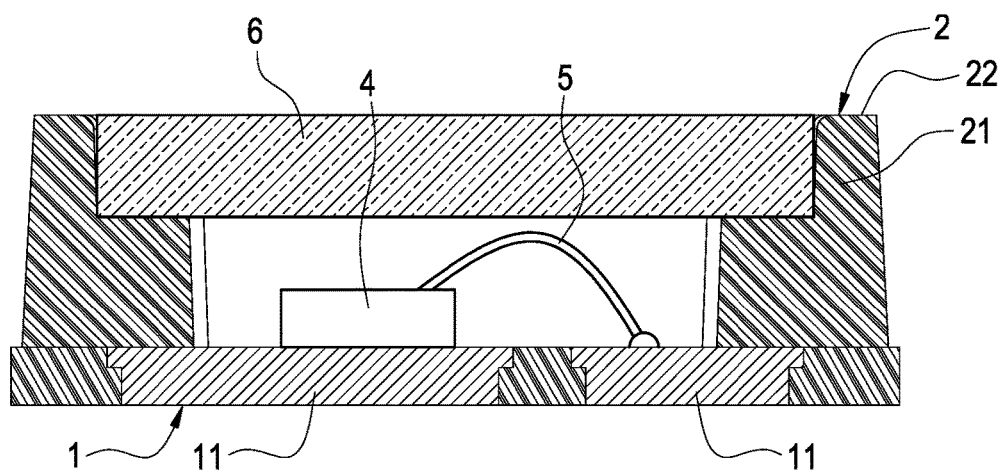
FIG. 5 shows the application of the mounting rack in FIG. 1.

FIG. 5 is a schematic view showing the application of the mounting rack of FIG. 1. As shown in FIG. 5, when the mounting rack of the present invention is used in a projector, the laser die 4 is die-bonded to one of the electrodes 11 of the leadframe 1. The bonding wire 5 is electrically connected to the laser die 4 and the electrodes 11 through wire bonding process, and the filtering lens 6 with transparent conductive wires (not shown) is arranged on stair-shaped cup opening 22 of the cup body 21. Therefore, the transparent conductive wires of the filtering lens 6 are electrically connected to two electrical-connection parts 32 of the circuit layer 3 to form the projector.

During the operation of the projector having the mounting rack with circuit, the mounting rack with circuit is electrically connected to a circuit board (not shown) and the laser die (laser diode) 4 is turned on to emit laser light toward the filtering lens 6. The filtering lens 6 projects the plurality of light dots generated by the laser die 4 to the object to be sensed (not shown). The reflected light of array of light dots are received by the infrared camera on the circuit board and are calculated to find the distance (depth) information corresponding to different locations in the contour of the object to be sensed. The depth information corresponding to the contour is then sent to a processor arranged on the circuit board to determine whether the identification of contour characteristics is correct.

When the filtering lens 6 is broken due to an external force exerted on the mounting rack with circuit, the conductive wires on the filtering lens 6 is correspondingly broken such that the filtering lens 6 cannot conduct electricity. When the projector is activated (turned on), the laser die within the mounting rack will not be turned on. Therefore, the filtering lens 6 will not project a plurality of light dots on the object to be sensed. For example, the supplied power may be sent through the filtering lens 6, and the laser die is not powered when the filtering lens 6 is broken.

Figure 6:
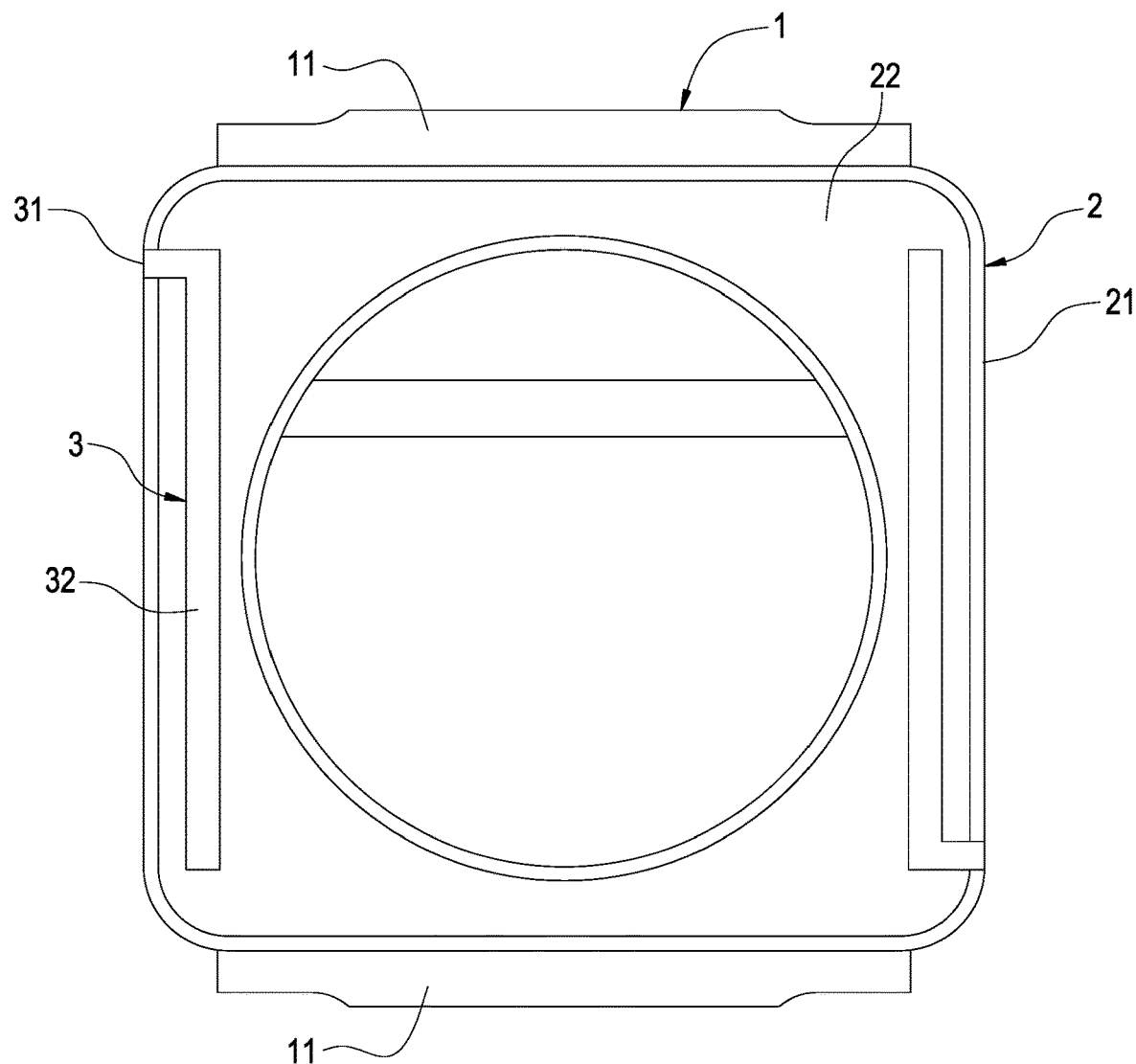
FIG. 6 shows the top view of the mounting rack with circuit according to the second embodiment of the present invention.
Figure 7:
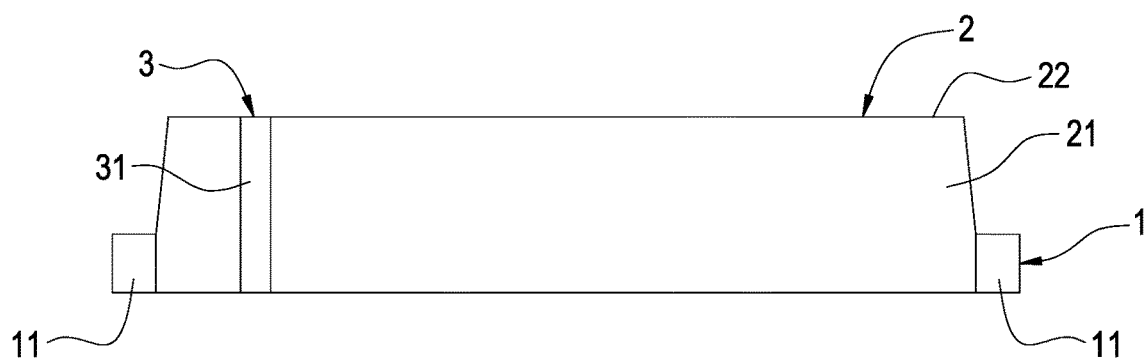
FIG. 7 is the sectional view corresponding to FIG. 6.
Figure 8:
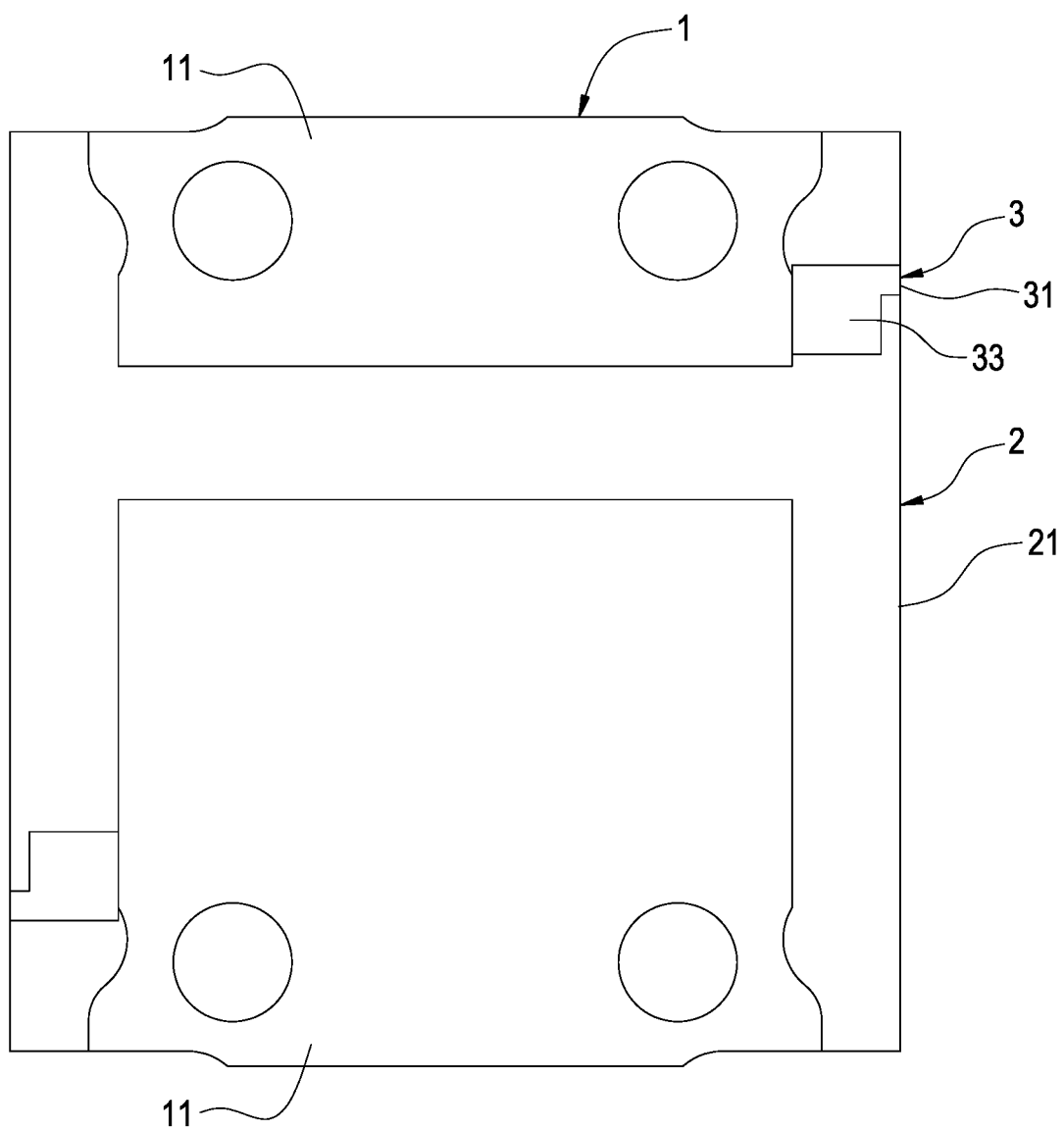
FIG. 8 is the bottom view corresponding to FIG. 6.

FIGS. 6 to 8 show the top view, the sectional view and the bottom view of the mounting rack with circuit according to the second embodiment of the present invention. The second embodiment is similar to the first embodiment except that the circuit layer 3 in the second embodiment needs not to be arranged in the two grooves 23 of the cup body 21. The two electrical-connection parts 32 of the circuit layer 3 are instead arranged on top portion of the cup opening 22 of the cup body 21. One end of one electrical-connection part 32 is electrically connected to one end of the respective conductive part 31. The two conductive parts 31 are arranged on surface (or cup wall) of the cup body 2 and extended to bottom of the cup body 21 such that the other ends of the conductive parts 31 are electrically connected to the respective two soldering pads 33 on bottom of the cup body 21. Besides, the two soldering pads 33 are respectively electrically connected to the electrodes 11 of the leadframe 1, or not electrically connected to the electrodes 11 of the leadframe 1.

In this embodiment, the circuit layer 3 needs not to be arranged in the two grooves 23 of the cup body 21, the mounting rack with circuit according to the second embodiment of the present invention can be more easily manufactured.

Figure 9:
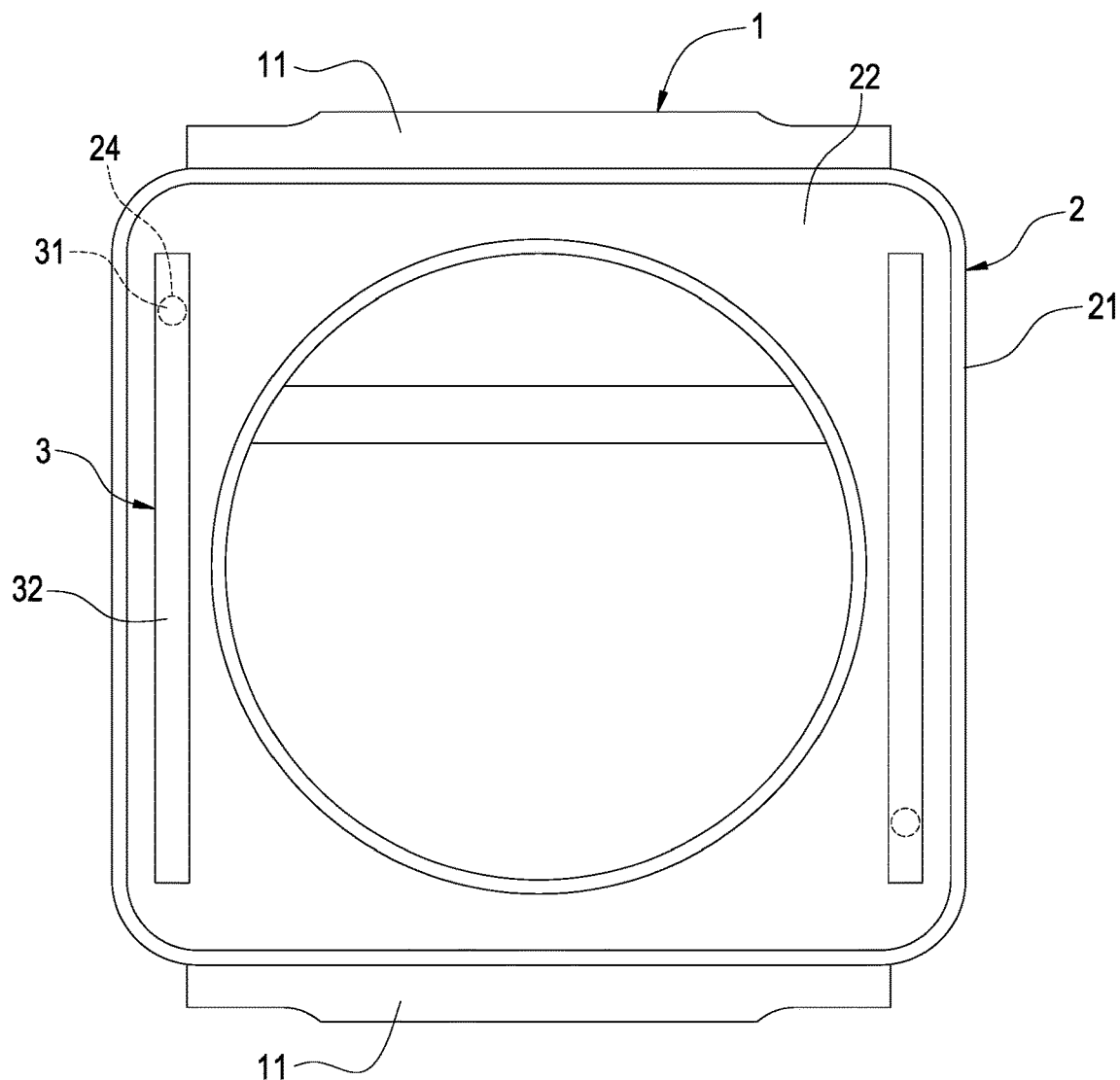
FIG. 9 shows the top view of the mounting rack with circuit according to the third embodiment of the present invention.
Figure 10:
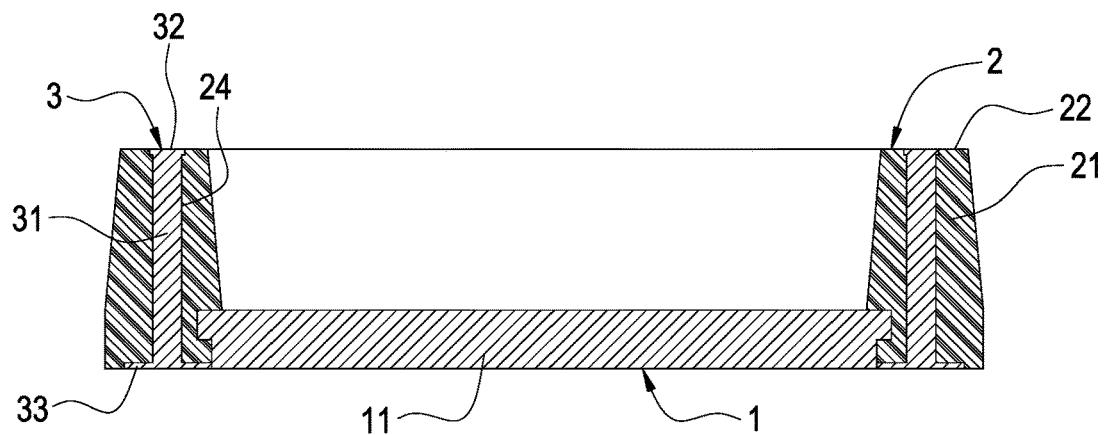
FIG. 10 is the sectional view corresponding to FIG. 9.
Figure 11:
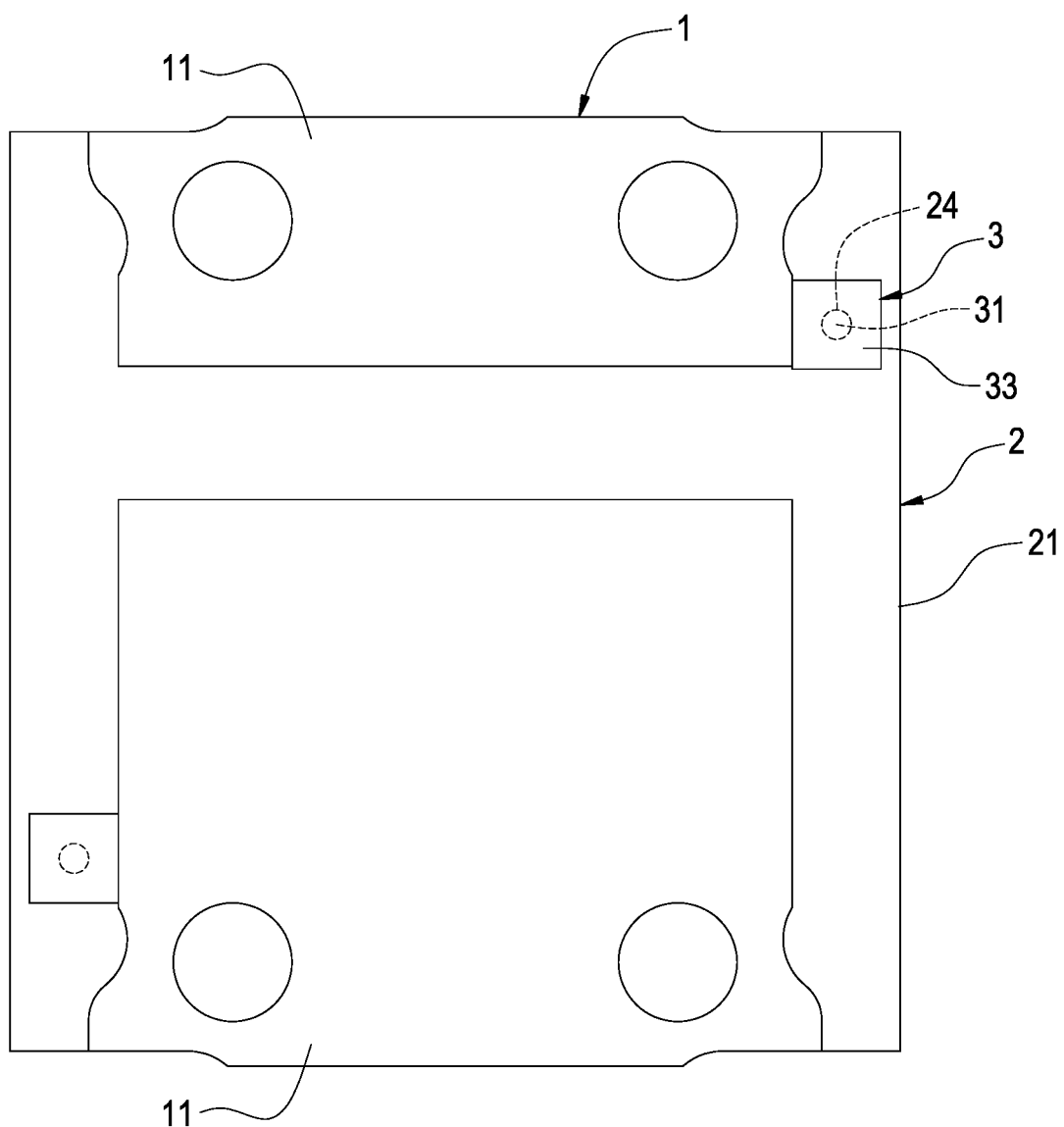
FIG. 11 is the bottom view corresponding to FIG. 9.

FIGS. 9 to 11 show the top view, the sectional view and the bottom view of the mounting rack with circuit according to the third embodiment of the present invention. The third embodiment is similar to the first and the second embodiments except that two symmetric through holes 24 are defined in the cup body 21, where the through hole 24 is opened from the top side of the cup opening 22 to the bottom side of the cup body 21. Metallic material is filled in the through holes 24 to from the two conductive parts 31 for the circuit layer 3. The two electrical-connection parts 32 of the circuit layer 3 are arranged on top portion of the cup opening 22 of the cup body 21. One end of one electrical-connection part 32 is electrically connected to the respective conductive part 31. The other ends of the conductive parts 31 are electrically connected to the respective two soldering pads 33 on bottom of the cup body 21. Therefore, the circuit connection can be hidden in the cup body in this embodiment. Besides, the two soldering pads 33 are respectively electrically connected to the electrodes 11 of the leadframe 1, or not electrically connected to the electrodes 11 of the leadframe 1.

Figure 12:
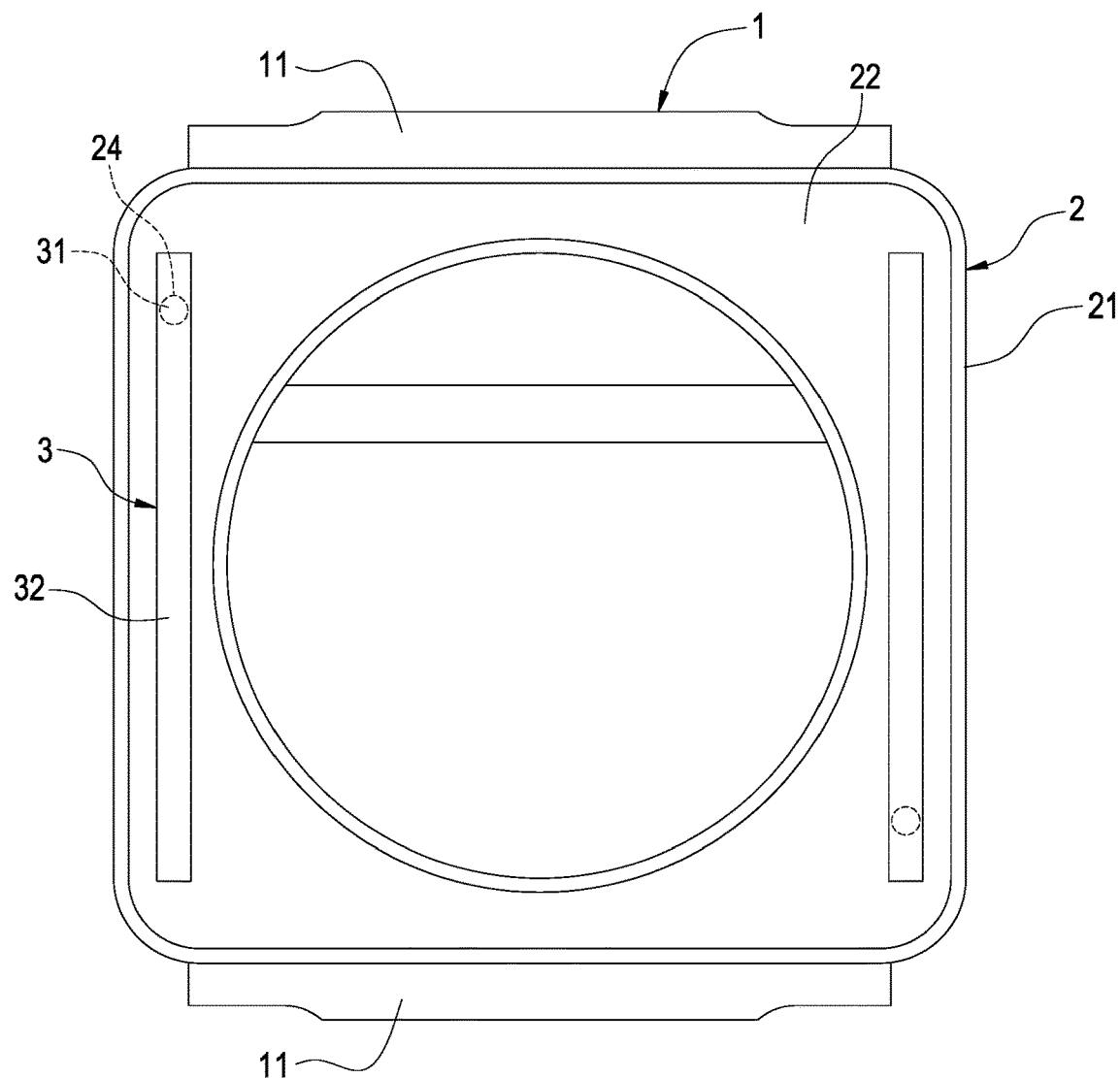
FIG. 12 shows the top view of the mounting rack with circuit according to the fourth embodiment of the present invention.
Figure 13:
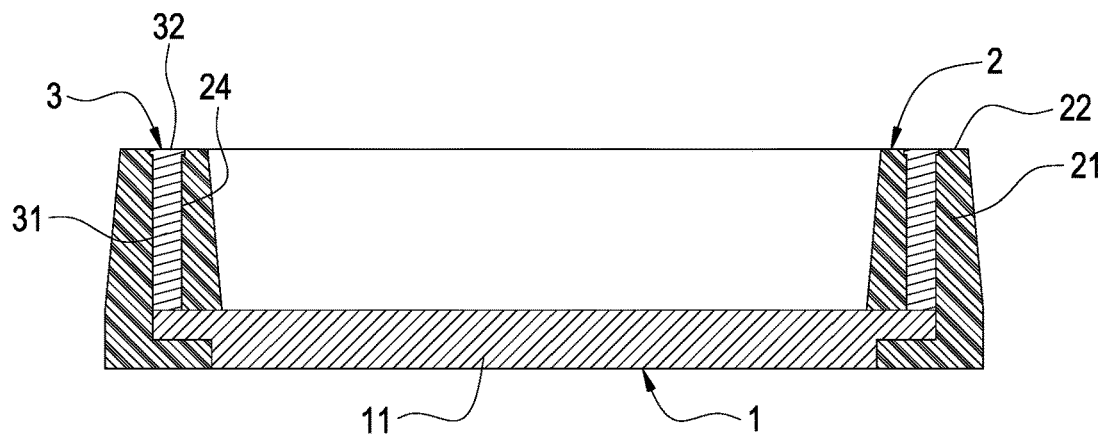
FIG. 13 is the sectional view corresponding to FIG. 12.
Figure 14:
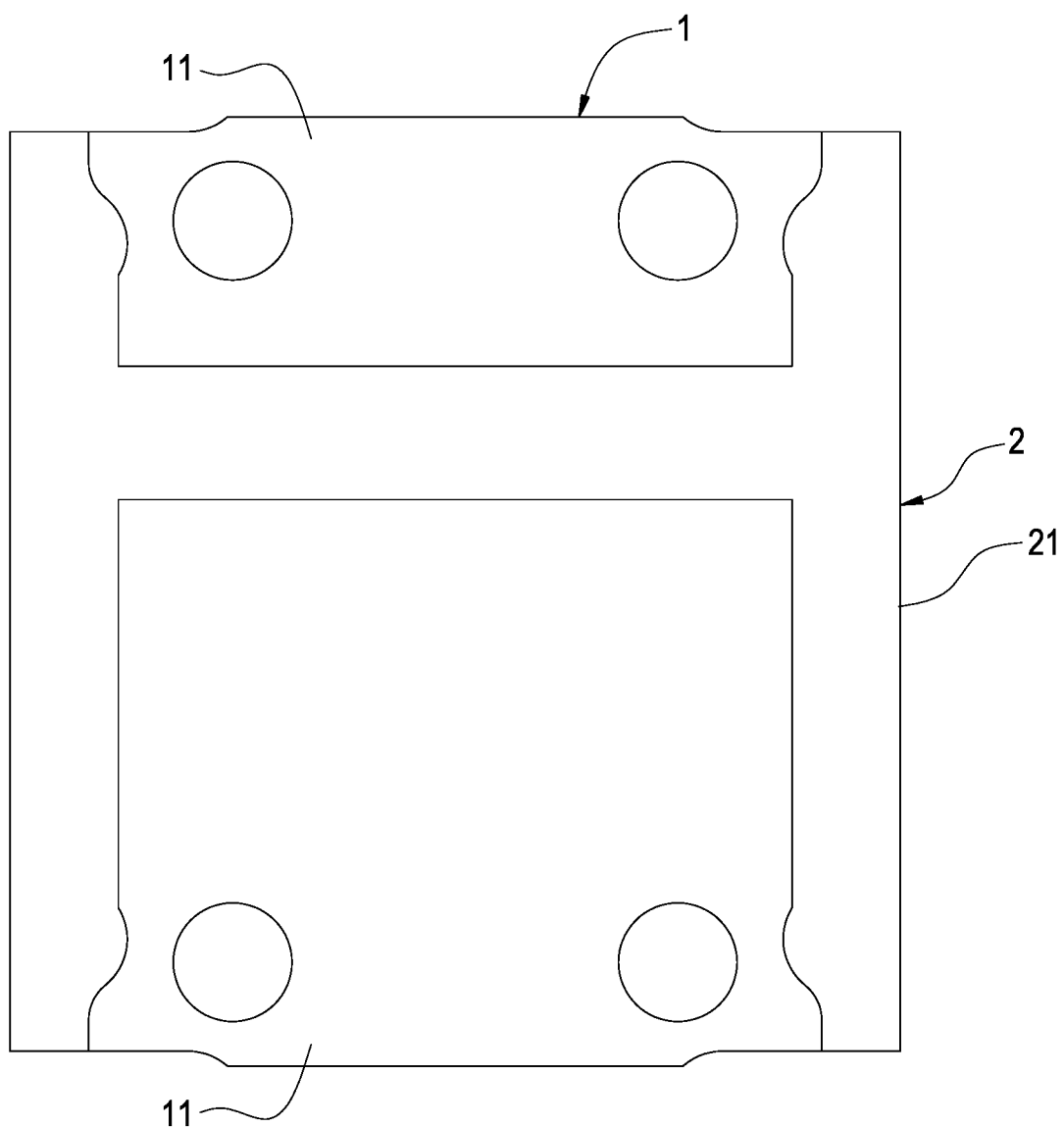
FIG. 14 is the bottom view corresponding to FIG. 12.

FIGS. 12 to 14 show the top view, the sectional view and the bottom view of the mounting rack with circuit according to the fourth embodiment of the present invention. The fourth embodiment is similar to the third embodiments except that, in the fourth embodiment, the two symmetric through holes 24 in the cup body 21 is opened from the top side of the cup opening 22 to the top sides of the electrodes 11 of the leadframe. Metallic material is filled in the through holes 24 to from the two conductive parts 31 for the circuit layer 3. The two electrical-connection parts 32 of the circuit layer 3 are arranged on top portion of the cup opening 22 of the cup body 21. One of the electrical-connection parts 32 is electrically connected to one end of the respective conductive part 31. The other end of the conductive part 31 is electrically connected to the respective one of the two electrodes 11 of the leadframe 1. Therefore, the circuit connection can be hidden in the cup body in this embodiment.

Figure 15:
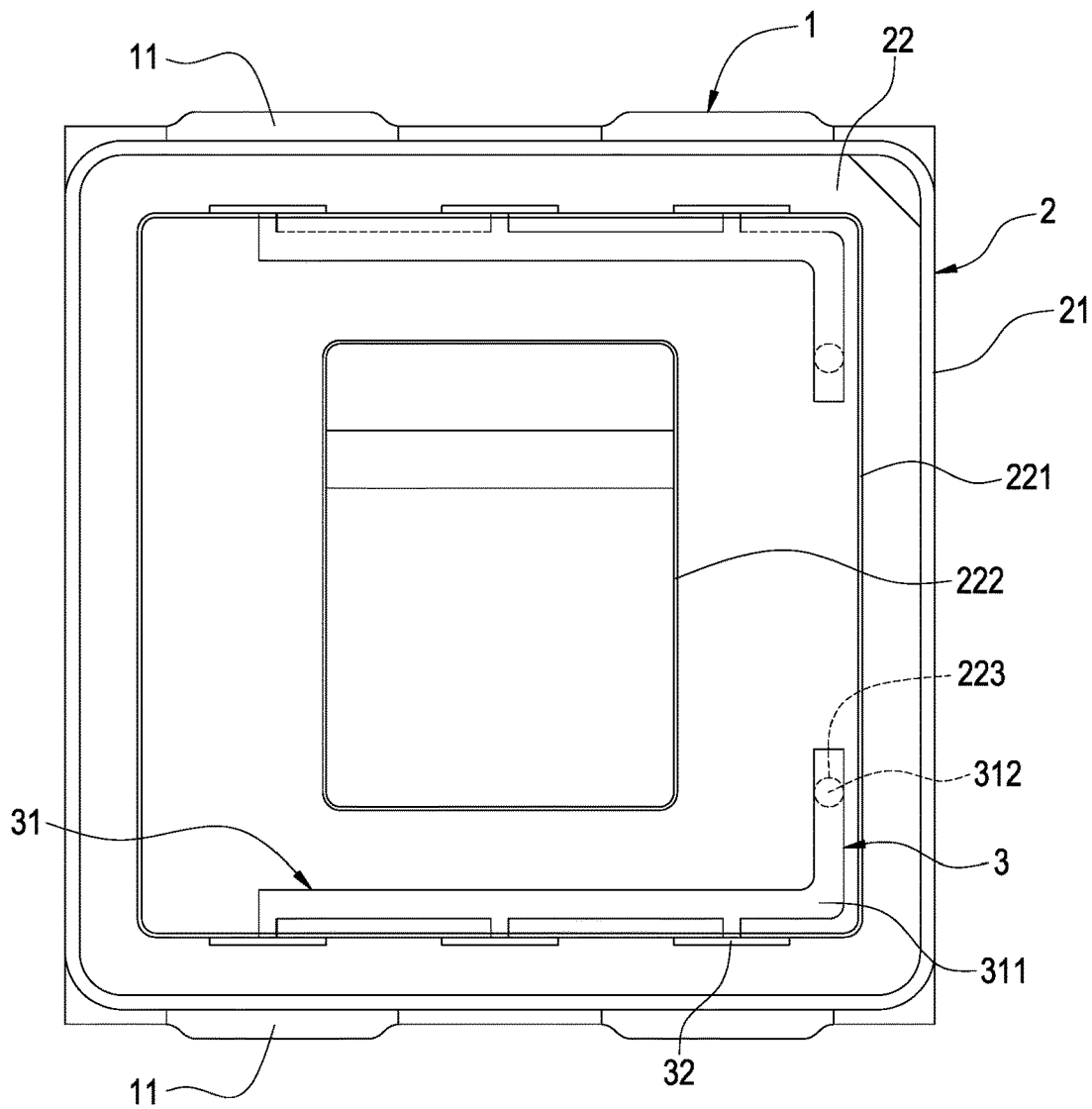
FIG. 15 shows the top view of the mounting rack with circuit according to the fifth embodiment of the present invention.
Figure 16:
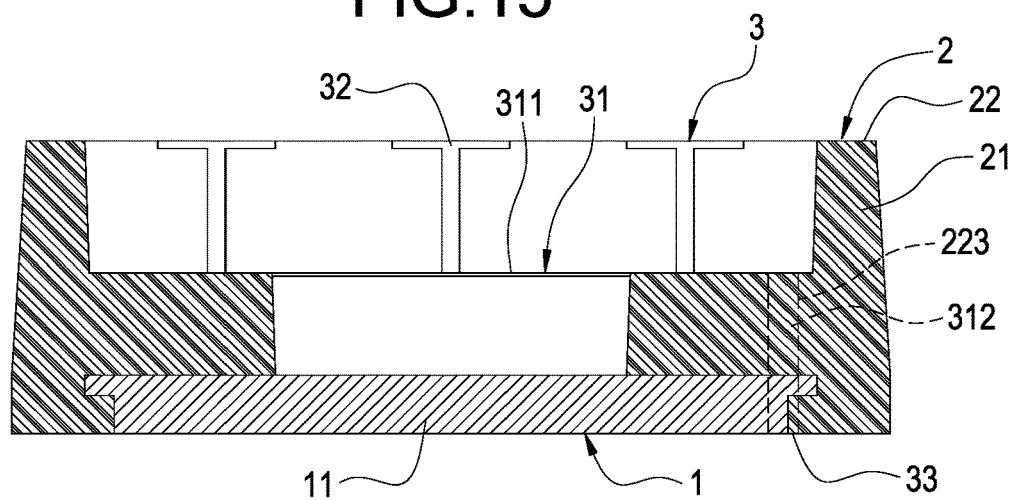
FIG. 16 is the sectional view corresponding to FIG. 15.
Figure 17:
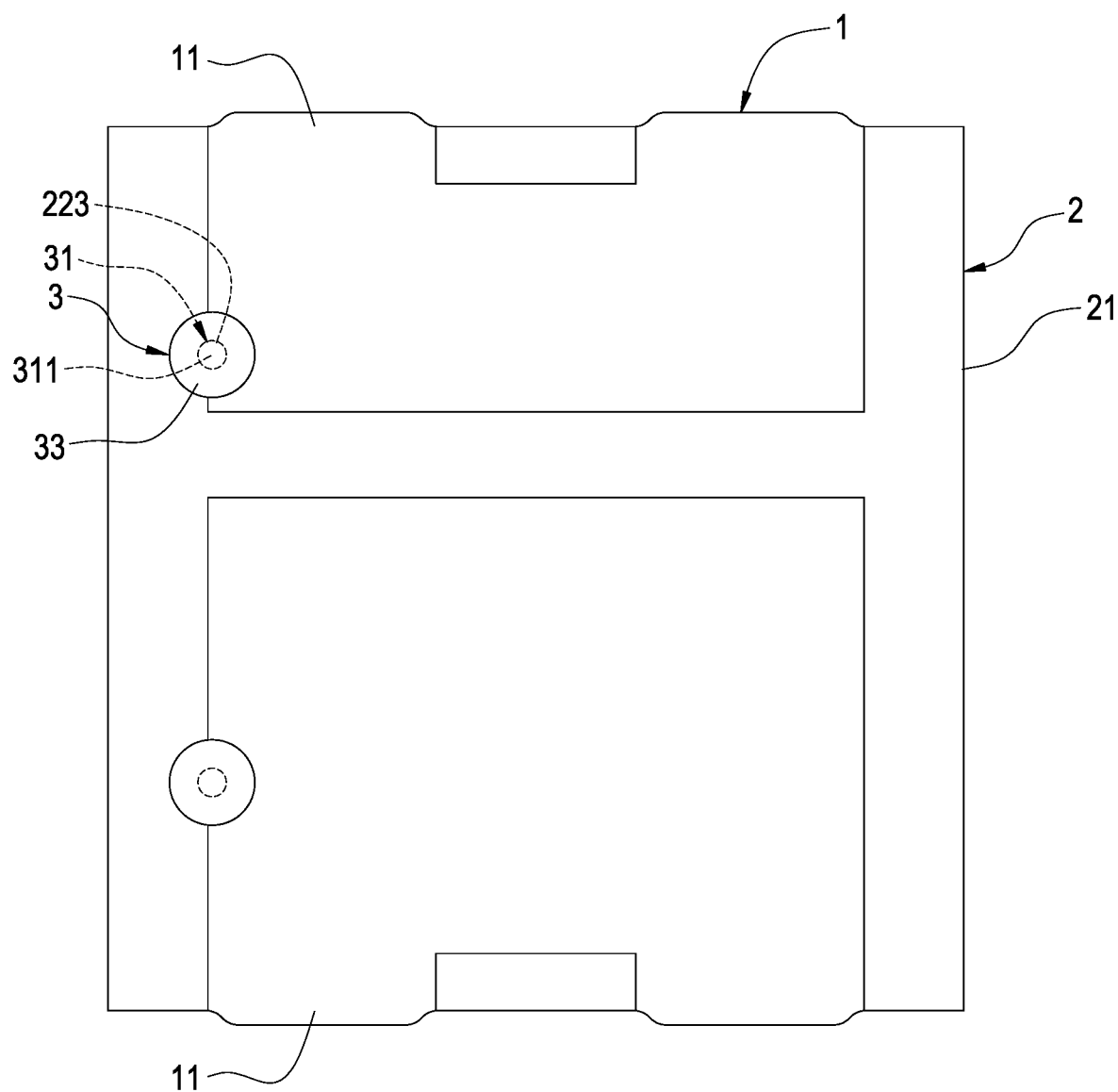
FIG. 17 is the bottom view corresponding to FIG. 15.

FIGS. 15 to 17 show the top view, the sectional view and the bottom view of the mounting rack with circuit according to the fifth embodiment of the present invention. The fifth embodiment is similar to the first to the fourth embodiments except that, in the fifth embodiment, two symmetric apertures 223 are defined on top face of the second cup opening 222, where the second aperture 223 is opened through the top side of the second cup opening 222 to the bottom side of the molding seat 2. Metallic material is filled in the aperture 223 to from two second conductive parts 312 of the two respective conductive parts 31. Two first conductive parts 311 of the two respective conductive parts 31 are arranged on top face of the second cup opening 222. One end of each of the second conductive parts 312 is electrically connected to one end of each of the first conductive parts 311. The other end of each of the first conductive parts 311 is electrically connected to the respective one of the two electrical-connection parts 32 arranged on top face and inner wall of the first cup opening 221. The other end of each of the second conductive parts 312 is electrically connected to the respective one of the soldering pads 33 on bottom of the cup body 21. Similarly, the circuit connection can be hidden in the cup body in this embodiment. In the shown embodiment, the electrical-connection parts 32 are implemented by T-shaped contacts.

The circuit layer 3 for the filtering lens 6 is manufactured on the cup body 21 of the molding seat 2. Therefore, the manufacture of the mounting rack is simplified. Besides, the circuit layer 3 is not damaged or broken due to the following-on process.

Although the present invention has been described with reference to the preferred embodiment thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. A mounting rack with circuit, the mounting rack comprising:
    a leadframe comprising a plurality of electrodes;
    a molding seat arranged on the leadframe and comprising a cup body, the cup body comprising a cup opening, wherein backsides of the electrodes are exposed through bottom of the cup body, and front sides of the electrodes are exposed through the cup opening; and
    a circuit layer arranged on the cup body and at least comprising two conductive parts, two electrical-connection parts and two soldering pads, wherein the two electrical-connection parts are arranged on the cup opening, one end of each of the two electrical-connection parts is electrically connected to one end of a respective one of the two conductive parts, the two soldering pads are arranged on bottom of the cup body, each of the two soldering pads is electrically connected to the other end of a respective one of the two conductive parts; wherein the cup body has two grooves extended from a top side of the cup opening to a bottom side of the cup body.

2. The mounting rack with circuit in claim 1, wherein the cup opening is of stair shape.

3. The mounting rack with circuit in claim 1, wherein the two conductive parts are respectively arranged in the two grooves, the two electrical-connection parts are arranged on inner wall of the cup body.

4. The mounting rack with circuit in claim 3, wherein the soldering pads are respectively electrically connected to the electrodes, or not electrically connected to the electrodes.

* * * * *